(12) United States Patent
Shirahama et al.

(10) Patent No.: US 6,226,223 B1
(45) Date of Patent: May 1, 2001

(54) LOW LATENCY DYNAMIC RANDOM ACCESS MEMORY

(75) Inventors: Masanori Shirahama, Kyoto; Tsutomu Fujita; Masashi Agata, both of Osaka; Kazunari Takahashi, Shiga; Naoki Kuroda, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/511,901

(22) Filed: Feb. 23, 2000

(30) Foreign Application Priority Data

Feb. 24, 1999 (JP) .................................................. 11-045966

(51) Int. Cl.⁷ .............................. G11C 8/00; G11C 11/24
(52) U.S. Cl. ...................... 365/233; 365/149; 365/230.05
(58) Field of Search ............................... 365/149, 189.04, 365/230.05, 233, 233.5, 189.07

(56) References Cited

U.S. PATENT DOCUMENTS 5,010,519 * 4/1991 Yoshimoto et al. .................. 365/149
5,666,323    9/1997 Zagar ................................... 365/233
5,808,959    9/1998 Kengeri et al. ...................... 365/233
5,856,940    1/1999 Rao ..................................... 365/149
5,923,593    7/1999 Hsu et al. ....................... 365/189.04
5,963,468  * 10/1999 Rao ..................................... 365/149

* cited by examiner

Primary Examiner—Son Mai
(74) Attorney, Agent, or Firm—McDermott, Will & Emery

(57) ABSTRACT

In a semiconductor memory device with multiple memory cells, each including a charge storage device and two transfer devices for transferring its charge, these memory cells are accessible with no select signal provided externally. The memory device includes a clock generator for generating first and second mutually complementary clock signals. In response to the first and second clock signals, one of first word lines and one of second word lines are activated alternately. Specifically, the first clock signal makes a memory cell accessible through a first bit line by activating the first word line and first transistor, while the second clock signal makes the memory cell accessible through a second bit line by activating the second word line and second transistor.

5 Claims, 15 Drawing Sheets

LOW LATENCY DYNAMIC RANDOM ACCESS MEMORY

BACKGROUND OF THE INVENTION

The present invention relates to a semiconductor memory device including a dynamic random access memory (DRAM), for example.

Hereinafter, a "low latency DRAM cell" using dual word lines and dual bit lines as disclosed in U.S. Pat. No. 5,856,940 will be described with reference to FIG. 20. Each cell of the low latency DRAM includes two transistors as transfer devices and a single storage capacitor as a charge storage device. And each memory cell is connected to two word lines and two bit lines.

FIG. 20 illustrates a circuit configuration for a low latency DRAM cell 100 in the known semiconductor memory device. AS shown in FIG. 20, the memory cell 100 includes first and second transistors 102 and 103 and a storage capacitor 104. The gate, drain and source of the first transistor 102 are connected to a first word line WLa, a first bit line BLa and a storage node 101, respectively. The gate, drain and source of the second transistor 103 are connected to a second word line WLb, a second bit line BLb and the storage node 101, respectively. One of the two electrodes of the storage capacitor 104 is connected to the storage node 101, while the other electrode thereof serves as a cell plate.

As can be seen, the memory cell 100 includes two independently controllable transistors 102 and 103 for one storage node 101. Accordingly, interleaving is possible between accessing the memory cell 100 using the first word line WLa, first transistor 102 and first bit line BLa and accessing the memory cell 100 using the second word line WLb, second transistor 103 and second bit line BLb. That is to say, while one of the two bit lines is being precharged, the memory cell 100 can be accessed using the other bit line. Thus, reading and writing can be performed at high speeds.

In a memory cell with such a configuration, one of the first and second transistors 102 and 103 should be activated by selecting one of the word lines WLa and WLb to start reading or writing. In selecting the word line, a select signal should be externally input from the outside of the semiconductor memory device or two clock signals should be input externally.

To input the select signal externally, however, a circuit for generating the select signal should be provided outside. Also, if the two clock signals need to be input externally from the outside of the semiconductor memory device, then a circuit for generating these two clock signals must be provided outside. Furthermore, any of these requirements leads to an increase in number of input terminals.

SUMMARY OF THE INVENTION

An object of the present invention is providing a semiconductor memory device with multiple low latency DRAM cells, each of which includes a charge storage device and first and second transfer devices connected to the storage device for transferring charge through different data input/output lines, and which are accessible without supplying any particular select signal or two clock signals externally.

A semiconductor memory device according to the present invention includes multiple memory cells. Each of these memory cells includes a charge storage device and first and second transfer devices. The first transfer device is driven by a first word line and connected between the charge storage device and a first data input/output line for transferring charge. The second transfer device is driven by a second word line and connected between the charge storage device and a second data input/output line for transferring charge. The memory device further includes a clock generator for generating first and second mutually complementary clock signals. In response to the first and second clock signals, one of the first word lines and one of the second word lines are activated alternately.

According to the present invention, the first transfer device, which is driven by one of the first word lines, and the second transfer device, which is driven by one of the second word lines, can be activated alternately responsive to the first and second clock signals generated by the clock generator. Thus, there is no need to provide the select signal or two clock signals externally in performing such an operation.

In one embodiment of the present invention, the clock generator adaptively changes levels of the first and second clock signals based on a level change of a reference clock signal input externally.

In such an embodiment, the first and second clock signals can be generated in synchronism with the reference clock signal.

In another embodiment of the present invention, the clock generator includes means for suspending the level changes of the first and second clock signals.

In such an embodiment, the memory cells and their peripheral circuitry can be deactivated by suspending the level changes of the first and second clock signals, thus reducing the power dissipation of the semiconductor memory device.

In still another embodiment, the clock generator includes means for making the first and second clock signals change into respectively predetermined levels when these signals change their levels for the first time.

In such an embodiment, when the memory device starts to operate, a particular one of the transfer devices in each memory cell can be activated earlier. Thus, it is possible to control which transfer device should be selected at a particular point in time without inputting any additional select signal.

In still another embodiment, the clock generator includes means for suspending the level changes of the first and second clock signals unless the memory device is accessed.

In such an embodiment, only when a memory cell is accessed, the clock generator changes the levels of the first and second clock signals and activates the memory cell and its peripheral circuit, thus reducing the power dissipation of the semiconductor memory device.

In still another embodiment, the memory device further includes an address comparator for detecting a change of row addresses. If the address comparator has sensed that a previous row address has been replaced with a new row address, then there is an interval during which one of the word lines that is associated with the previous row address and another one of the word lines that is associated with the new row address are both activated. On the other hand, if the address comparator has sensed no row address change, then there is no interval during which the first and second word lines that are associated with a current row address are both activated.

In such an embodiment, the first transfer devices of memory cells belonging to a certain row and the second transfer devices of memory cells belonging to another row can be activated simultaneously, while the first and second transfer devices in the same memory cell are not activated at the same time.

In still another embodiment, if the address comparator has sensed no row address change, then an activated one of the first and second word lines that are associated with a current row address is deactivated at a first time. Alternatively, if the address comparator has sensed that a previous row address has been replaced with a new row address, then an activated one of the word lines that is associated with the previous row address is deactivated at a second time. In this case, an interval between a reference point in time the address comparator made a comparison and the first time is shorter than an interval between the reference point and the second time.

In such an embodiment, an activated one of the first and second transfer devices in the same memory cell can be deactivated first, and then the other transfer device can be activated.

In still another embodiment, if the address comparator has sensed no row address change, then the changes in signal levels on the first and second word lines are suspended.

In such an embodiment, while one of the first and second word lines associated with the same row address is activated, the other word line is not activated.

DESCRIPTION OF THE PREFERRED EMBODIMENTS

Hereinafter, embodiments of the present invention will be described with reference to the accompanying drawings.

EMBODIMENT 1

Figure 1:
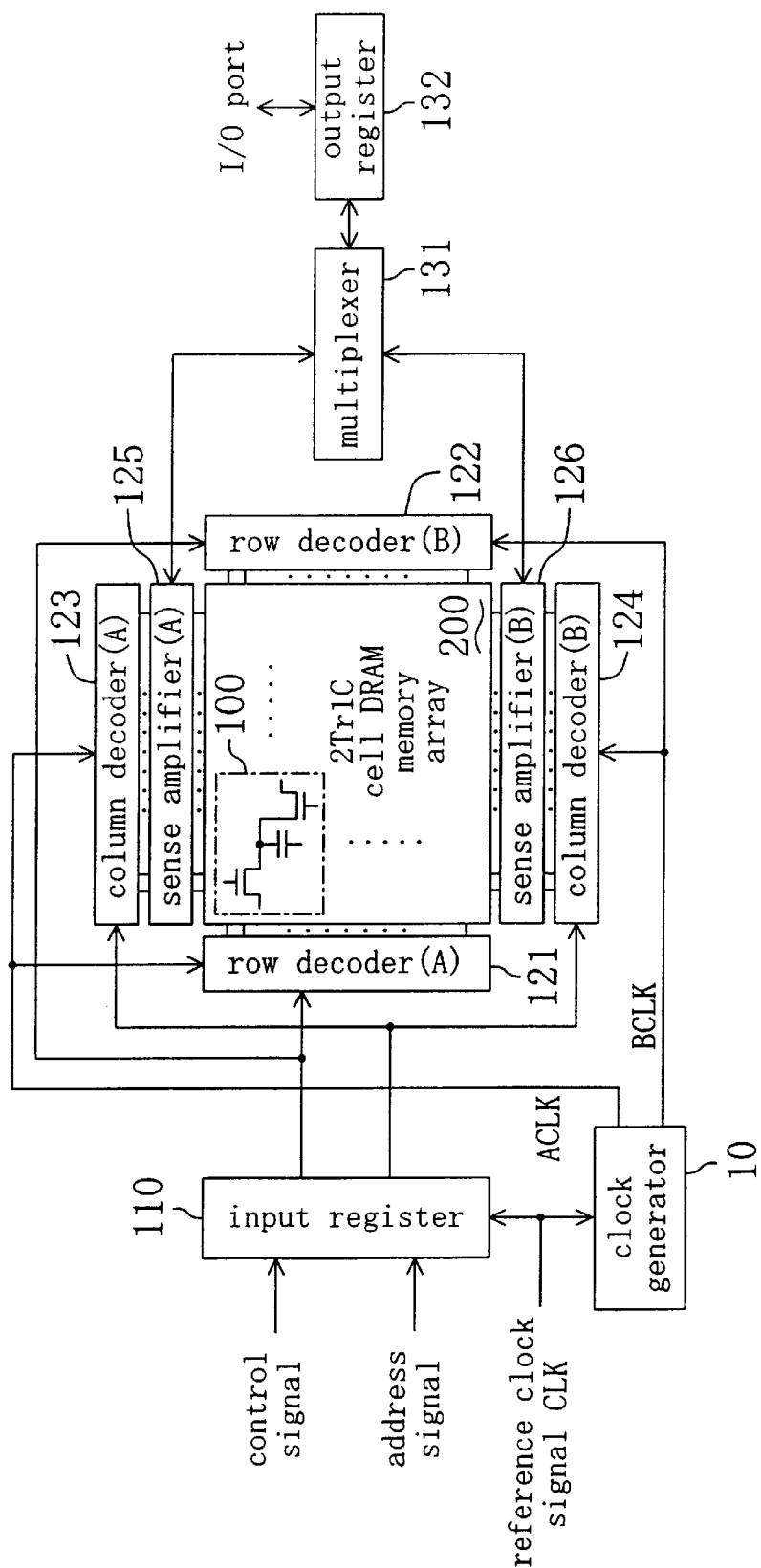
FIG. 1 is a block diagram illustrating an overall configuration for a semiconductor memory device according to a first embodiment of the present invention.

FIG. 1 illustrates an overall configuration for a semiconductor memory device according to a first embodiment of the present invention. As shown in FIG. 1, the semiconductor memory device includes a DRAM memory array 200 with multiple memory cells 100. Each of these memory cells 100 includes first and second transistors 102 and 103 functioning as first and second transfer devices, respectively, and a storage capacitor 104 functioning as a charge storage device as in the known memory cell shown in FIG. 20. In this specification, such a memory cell 100 will be referred to as a "2Tr1C memory cell". The memory device further includes clock generator 10, input register 110, row decoders (A) 121 and (B) 122, column decoders (A) 123 and (B) 124, sense amplifiers (A) 125 and (B) 126, multiplexer 131 and output register 132. In the following description, an address specifying a word line will be called a "row address".

As shown in FIG. 1, reference clock signal CLK, control signal and address signal are input to the input register 110. The input register 110 outputs a row address signal to the row decoders (A) 121 and (B) 122 and a column address signal to the column decoders (A) 123 and (B) 124, respectively. The control signal is used to control a mode of operation such as read and write, and the detailed description thereof will be omitted herein. The sense amplifiers (A) 125 and (B) 126 exchanges data with an I/O port by way of the multiplexer 131 and output register 132. Responsive to the reference clock signal CLK externally provided, the clock generator 10 generates first and second clock signals ACLK and BCLK. Then, the generator 10 outputs the first clock signal ACLK to the row and column decoders (A) 121 and 123 and the second clock signal BCLK to the row and column decoders (B) 122 and 124, respectively.

While the level of the first clock signal ACLK is represented by a high ("H") potential, the row decoder (A) 121 keeps one of the first word lines WLa activated (or keeps the signal level on the word line WLa "H"), thereby continuously activating the first transistors 102 of the memory cells connected to the activated word line. In the same way, while the level of the second clock signal BCLK corresponds to the "H" level, the row decoder (B) 122 keeps one of the second word lines WLb activated, thereby continuously activating the second transistors 103 of the memory cells connected to the activated word line. The column decoders (A) 123 and (B) 124 operate in synchronism with the first and second clock signals ACLK and BCLK, respectively.

Figure 2:
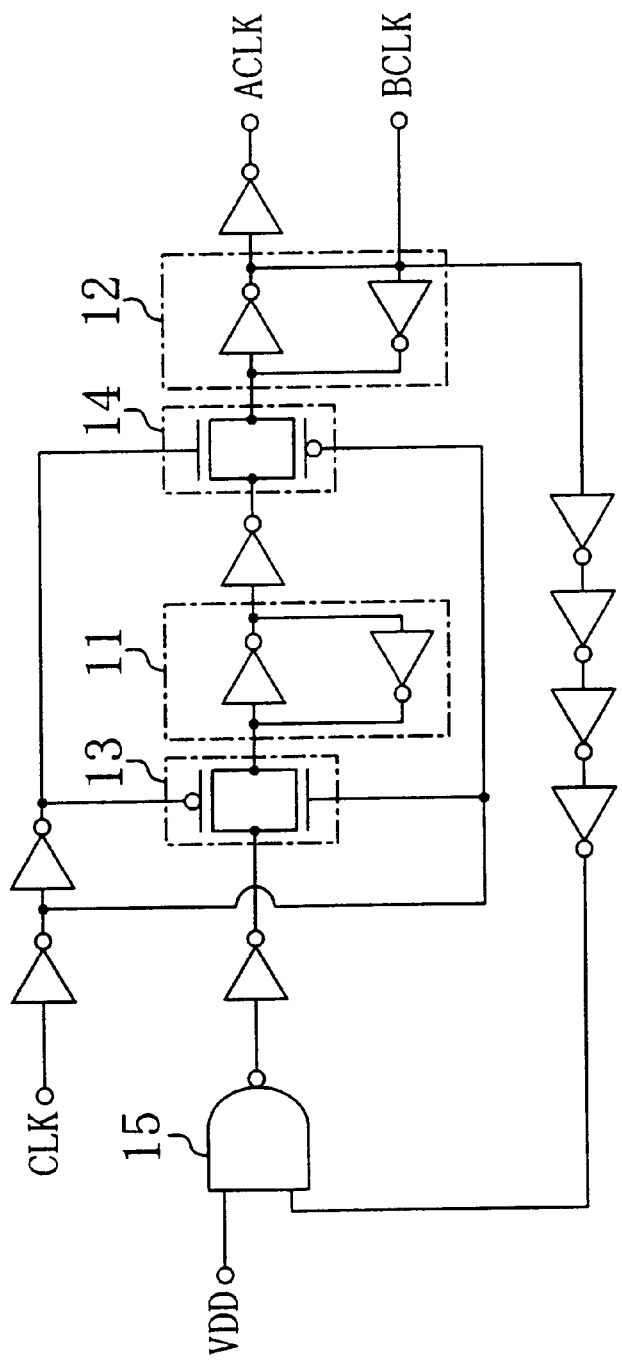
FIG. 2 is a circuit diagram illustrating a configuration for a clock generator in the semiconductor memory device according to the first embodiment.

FIG. 2 illustrates a circuit configuration for the clock generator 10 in the semiconductor memory device according to the first embodiment. As shown in FIG. 2, the clock generator 10 includes first and second latch circuits 11 and 12, first and second transfer gates 13 and 14, NAND gate 15 and multiple inverters.

Each of the first and second latch circuits 11 and 12 includes two inverters. In these latch circuits 11 and 12, the output of one of the two inverters is input to the other inverter. Accordingly, each of the first and second latch circuits 11 and 12 outputs an inverted version of an input signal. Since a supply voltage VDD is provided to one of the two inputs of the NAND gate 15, the NAND gate 15 outputs an inverted version of the other input, or functions as an inverter. That is to say, the clock generator 10 shown in FIG. 2 operates as a ring oscillator, in which nine inverters are connected in a loop, and the first and second transfer gates 13 and 14 are inserted into the loop to control the oscillation operation thereof. The first and second transfer gates 13 and 14 are controlled to operate complementarily in response to the reference clock signal CLK input externally. The output terminal of the first transfer gate 13 is connected to the input terminal of the second transfer gate 14 via the first latch circuit 11 and a single inverter. The second latch circuit 12 is located on the output end of the second transfer gate 14. The clock generator 10 provides the output of the second latch circuit 12 as the second clock signal BCLK and an inverted signal thereof as the first clock signal ACLK, respectively.

Next, it will be described how the clock generator 10 shown in FIG. 2 operates. While the level of the reference clock signal CLK is represented by a low potential ("L"), the first transfer gate 13 turns ON, but the second transfer gate 14 turns OFF. Suppose the levels of the first and second clock signals ACLK and BCLK are represented as "L" and "H", respectively. In such a case, the output signal of the first latch circuit 11 is at the "L" level.

Thereafter, when the level of the reference clock signal CLK is inverted to "H", the first transfer gate 13 turns OFF but the second transfer gate 14 turns ON. Thus, the output signal of the second latch circuit 12 falls to the "L" level. That is to say, the first and second clock signals ACLK and BCLK are inverted to the "H" and "L" levels, respectively.

After that, when the level of the reference clock signal CLK is inverted to "L" again, the first transfer gate 13 turns ON and the second transfer gate 14 turns OFF again. As a result, the output of the first latch circuit 11 rises to the "H" level.

Thereafter, when the level of the reference clock signal CLK is inverted to "H" again, the first transfer gate 13 turns OFF but the second transfer gate 14 turns ON. Thus, the output signal of the second latch circuit 12 rises to the "H" level. That is to say, the first and second clock signals ACLK and BCLK are inverted to the "L" and "H" levels, respectively.

And when the reference clock signal CLK falls to the "L" level again, the first transfer gate 13 turns ON and the second transfer gate 14 turns OFF again. As a result, the output of the first latch circuit 11 falls to the "L" level.

In this manner, every time the reference clock signal CLK rises from "L" into "H" level, the first and second clock signals ACLK and BCLK repeatedly invert their levels.

Figure 3:
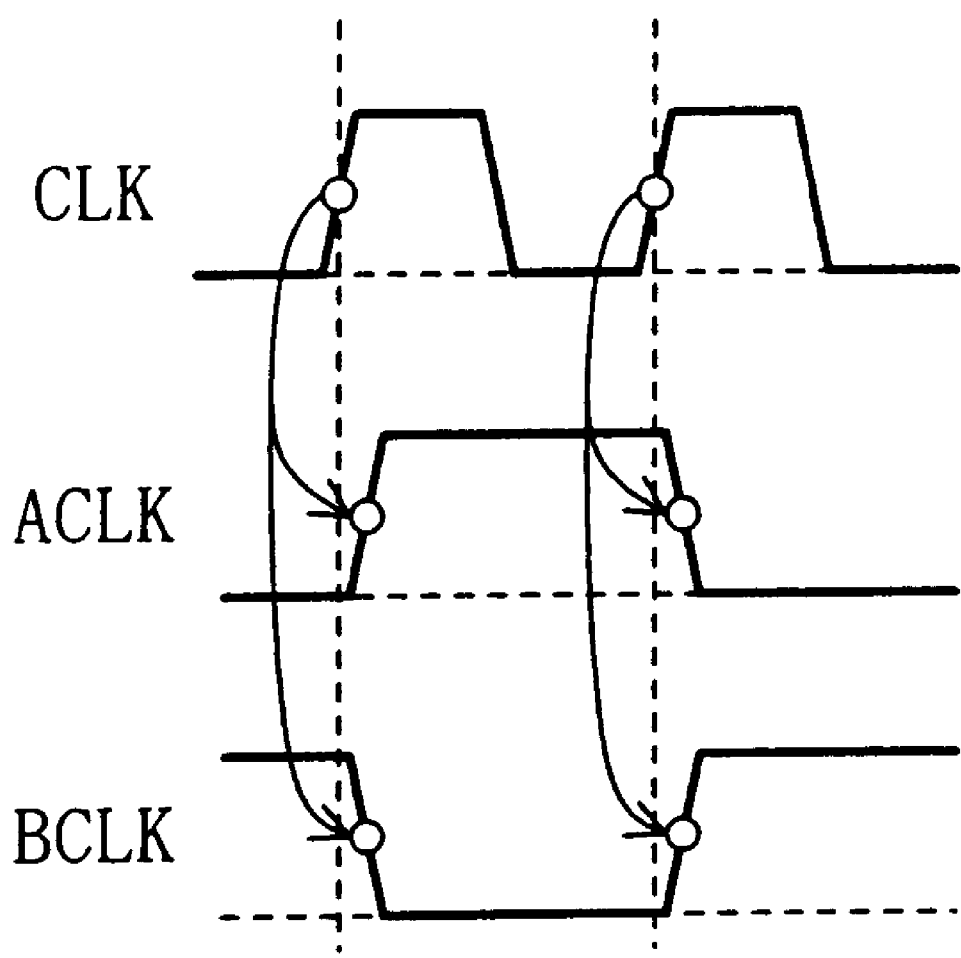
FIG. 3 is a timing diagram illustrating respective level changes with time of a reference clock signal and first and second clock signals output from the clock generator shown in FIG. 2.

FIG. 3 illustrates respective level changes with time of the reference clock signal CLK and the first and second clock signals ACLK and BCLK output from the clock generator 10 shown in FIG. 2. As shown in FIG. 3, the first and second clock signals ACLK and BCLK always satisfy a complementary relationship, i.e., if the level of one of these signals is "L", then the level of the other is "H". Accordingly, the 2Tr1C memory cell 100 shown in FIG. 20 can perform interleaved reading or writing by selectively activating the first word line WLa, first transistor 102 and first bit line BLa as a first data input/output line responsive to the first clock signal ACLK or the second word line WLb, second transistor 103 and second bit line BLb as a second data input/output line responsive to the second clock signal BCLK.

Figure 4:
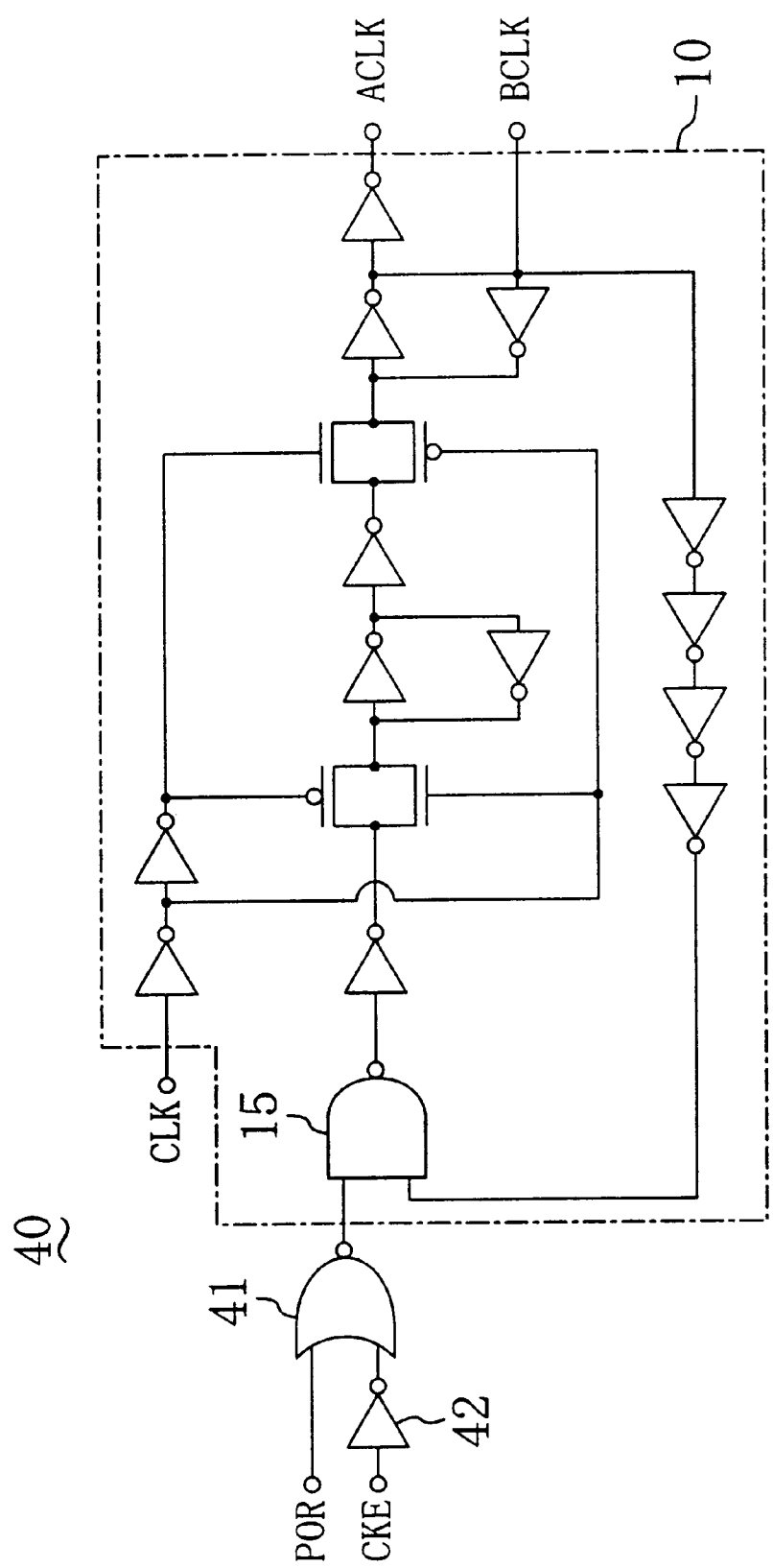
FIG. 4 is a circuit diagram illustrating a modified version of the clock generator shown in FIG. 2.

FIG. 4 illustrates a modified version 40 of the clock generator 10 shown in FIG. 2. The clock generator 40 shown in FIG. 4 further includes a NOR gate 41 and an inverter 42 in addition to all the components of the clock generator 10 shown in FIG. 2. Also, the output of the NOR gate 41, not the supply voltage VDD, is input to one of the input terminals of the NAND gate 15. The NOR gate 41 receives a power ON reset signal POR at one of its input terminals and the output signal of the inverter 42 at the other input terminal thereof. A clock enable signal CKE is input to the inverter 42.

Suppose the levels of the power ON reset signal POR and clock enable signal CKE are both "L". In such a situation, the output signal of the NOR gate 41 is at the "L" level and that of the NAND gate 15 remains at the "H" level. Accordingly, the first and second clock signals ACLK and BCLK are fixed at the "L" and "H" levels, respectively. But if the level of the clock enable signal CKE is raised to the "H" level, then the output signal of the NOR gate 41 rises to the "H" level. Accordingly, the NAND gate 15, which receives the "H"-level output of the NOR gate 41 at one of its input terminals, starts to invert and output the signal received at the other input terminal thereof. That is to say, the NAND gate 15 initially inverts the level of its output signal from "H" into "L" and then successively inverts the output signal levels every time the reference clock signal CLK rises from "L" into "H" level. Specifically, first, the first clock signal ACLK inverts its signal level from "L" into "H", while the second clock signal. BCLK inverts its signal level from "H" into "L". Thereafter, these clock signals will keep on inverting their levels.

Thus, when an interleaved operation should be performed between the two transistors 102 and 103 in a 2Tr1C memory cell 100, one of the transistors can be activated earlier than the other without inputting any particular select signal if the clock generator 10 shown in FIG. 2 is replaced with the counterpart 40 shown in FIG. 4. For example, supposing the first clock signal ACLK changes its level from "L" into "H" at first, the first transistor 102 can be activated earlier and then an interleaved operation can be started between the first and second transistors 102 and 103.

The same statement is applicable to a situation where the first and second clock signals ACLK and BCLK are made to start changing their levels by changing the level of the power ON reset signal POR from "H" into "L" while the clock enable signal CKE is at the "H" level. That is to say, a predetermined one of the transistors is always activated when the first and second clock signals ACLK and BCLK change their levels for the first time after the device has been powered.

Figure 5:
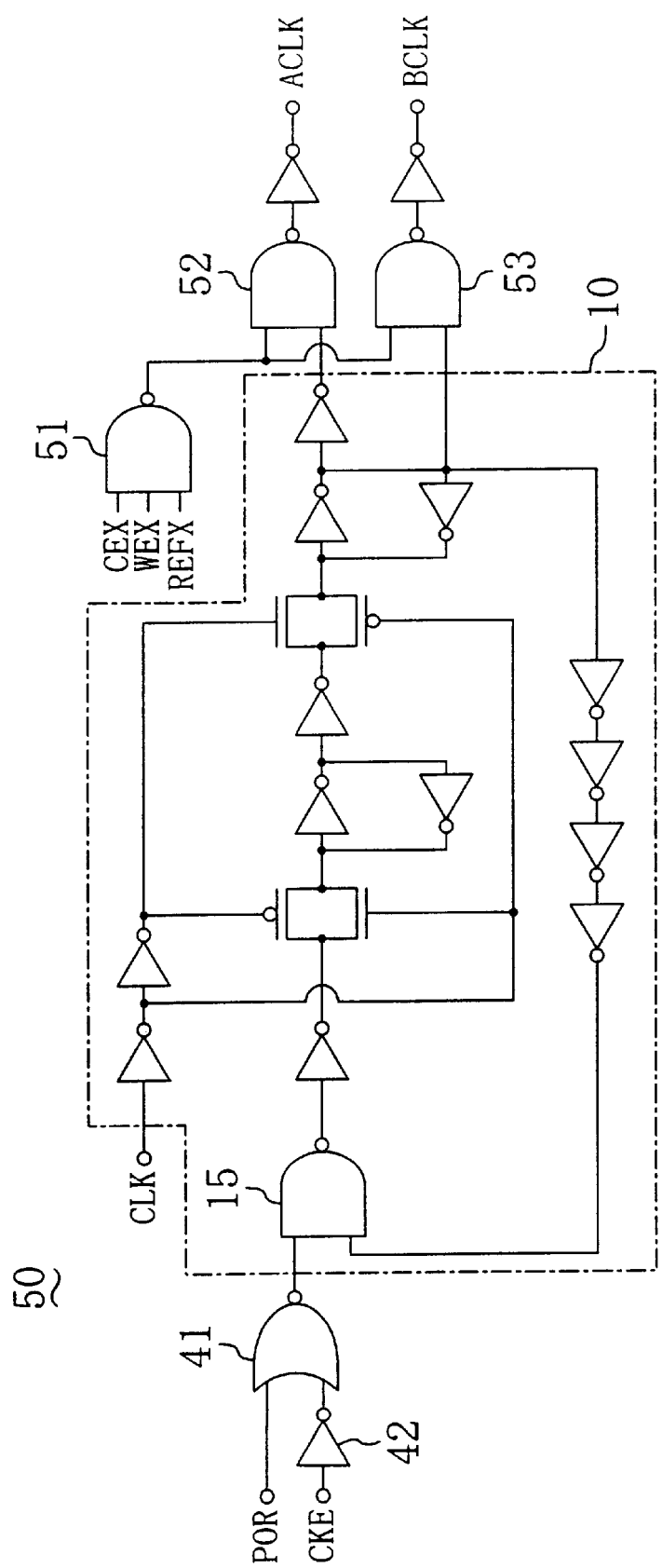
FIG. 5 is a circuit diagram illustrating a modified version of the clock generator shown in FIG. 4.

FIG. 5 illustrates a modified version 50 of the clock generator 40 shown in FIG. 4. The clock generator 50 shown in FIG. 5 further includes three NAND gates 51, 52 and 53 in addition to all the components of the clock generator 40 shown in FIG. 4. Three control signals, namely, chip enable CEX, write enable WEX and refresh enable signals REFX are input to the NAND gate 51. The NAND gates 52 and 53 respectively receive the first and second clock signals ACLK and BCLK from the clock generator 40 shown in FIG. 4 at one of their input terminals and also receive the output of the NAND gate 51 at the other input terminal thereof.

First, suppose the semiconductor memory device is not being accessed now. In such a situation, all of the three control signals, or the chip enable CEX, write enable WEX and refresh enable signals REFX, are at the "H" level. Thus, the output of the NAND gate 51 is at the "L" level, and the outputs of the NAND gates 52 and 53 remain at the "H" level. That is to say, the first and second clock signals ACLK and BCLK shown in FIG. 5 are fixed at the "L" level.

On the other hand, suppose the semiconductor memory device is now being accessed and at least one of the chip enable CEX, write enable WEX and refresh enable signals REFX is/are at the "L" level. In such a situation, the output of the NAND gate 51 is at the "H" level. Since the NAND gates 52 and 53 function as inverters in such a case, the first and second clock signals ACLK and BCLK will successively invert their levels every time the reference clock signal CLK rises from "L" into "H" level as already described for the clock generator 10 shown in FIG. 2.

As can be seen, if the clock generator 10 shown in FIG. 2 is replaced with the clock generator 50 shown in FIG. 5, the level changes of the first and second clock signals ACLK and BCLK can be suspended using the control signals. Accordingly, while the semiconductor memory device is not being accessed, the memory array 200 and its peripheral circuitry such as decoders, which operate in response to the first and second clock signals ACLK and BCLK, do not operate unnecessarily, thus cutting down the power dissipation of the semiconductor memory device.

Figure 20:
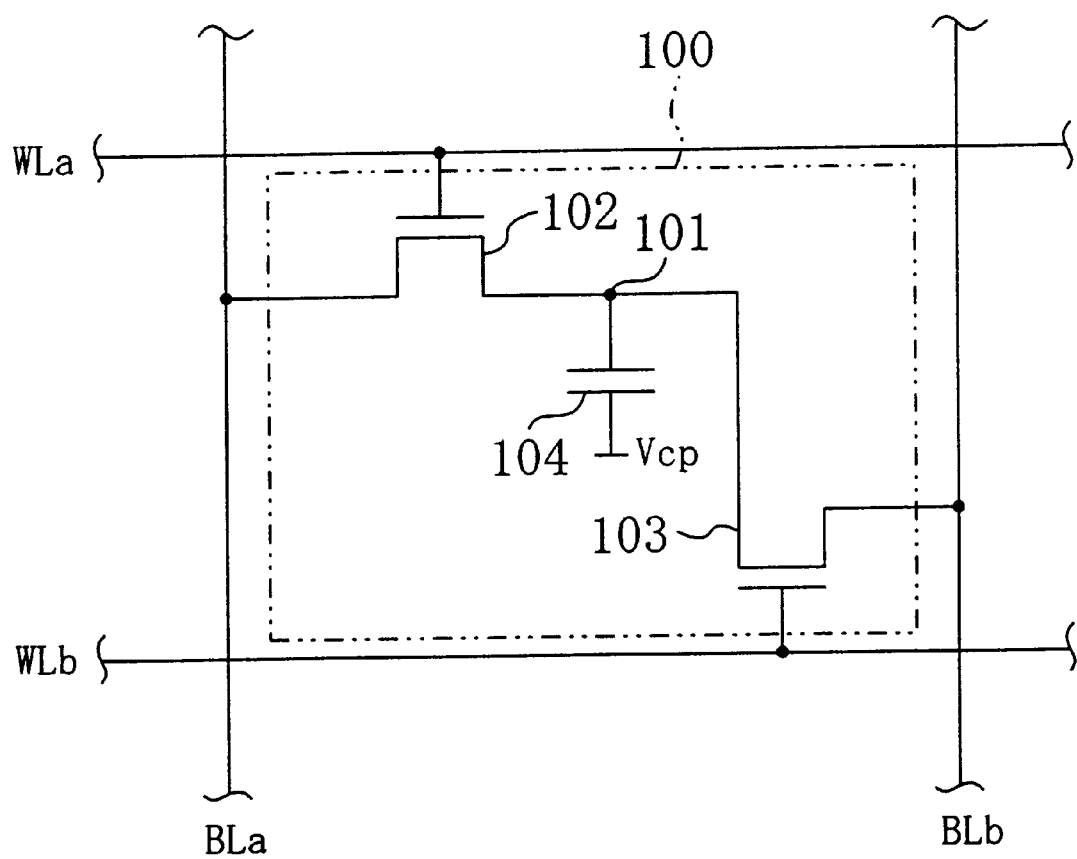
FIG. 20 is a circuit diagram illustrating a configuration for a low latency DRAM cell in a known semiconductor memory device.

As described above, the semiconductor memory device including the 2Tr1C memory cells 100 such as that shown in FIG. 20 accesses the memory cells by alternately using one of the first word lines WLa and one of the second word lines WLb.

Hereinafter, a drawback of the semiconductor memory device of the type including the 2Tr1C memory cells 100 will be described. In the 2Tr1C memory cell 100 shown in FIG. 20, it takes a certain charge/discharge time Tc to set the storage node 101 at the "H" or "L" level by charging or discharging the storage capacitor 104. Suppose the frequency of the reference clock signal CLK is relatively low and the interval at which the first and second clock signals ACLK and BCLK invert their levels is longer than the charge/discharge time Tc of the storage capacitor 104. In such a situation, a desired memory cell 100 is accessible by selectively using one of the first word lines WLa or one of the second word lines WLb every time the first and second clock signals ACLK and BCLK invert their levels.

However, if the frequency of the reference clock signal CLK is increased to make the semiconductor memory device operate faster, then the interval at which the first and second clock signals ACLK and BCLK invert their levels becomes shorter than the charge/discharge time Tc of the storage capacitor 104. Accordingly, in such a situation, once the first clock signal ACLK has risen to the "H" level, one of the first word lines WLa should be activated and will have to be kept activated until some time after the first clock signal ACLK has fallen to the "L" level. That is to say, an interval during which one of the first word lines WLa should be activated needs to overlap with an interval during which one of the second word lines WLb should be activated. In this specification, a memory access using two word lines activated concurrently in this manner will be called "overlapping access".

Figure 6:
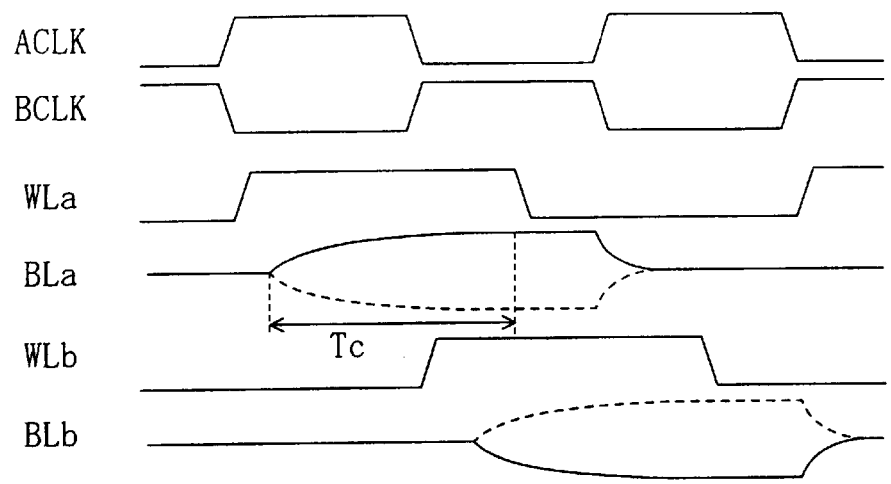
FIG. 6 is a timing diagram illustrating how the semiconductor memory device shown in FIG. 1 operates if the frequency of the reference clock signal is relatively high.

FIG. 6 illustrates how the semiconductor memory device shown in FIG. 1 operates if the frequency of the reference clock signal CLK is relatively high. In this case, if the row address of a memory cell to be accessed through the first word line WLa is different from that of a memory cell to be accessed through the second word line WLb, then there is no problem. However, if these row addresses are the same (i.e., if the memory cells associated with the same row address are accessed consecutively), then there is a problem. This is because the first and second bit lines BLa and BLb are connected together via the first and second transistors 102 and 103 in each memory cell associated with the row address.

Figure 7:
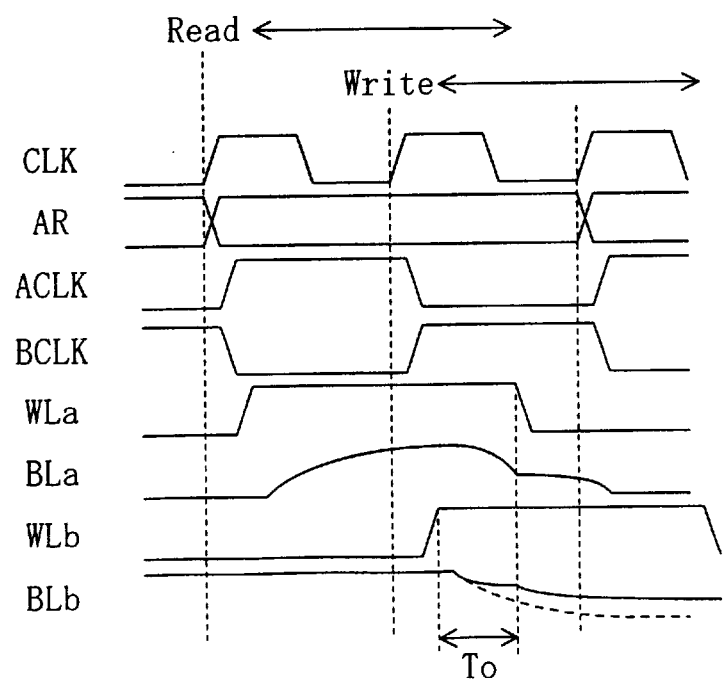
FIG. 7 is a timing diagram illustrating what problem will be brought about if the "overlapping access" is caused in the semiconductor memory device shown in FIG. 1.

FIG. 7 illustrates what problem will be brought about if the "overlapping access" was caused in the semiconductor memory device shown in FIG. 1. For example, suppose information "H" is stored in a memory cell. FIG. 7 illustrates a situation where readout or refresh is being performed on the memory cell by way of the first bit line BLa, while at the same time information "L" is being written on another memory cell associated with the same row address through the second bit line BLb.

As shown in FIG. 7, when the first clock signal ACLK is asserted to the "H" level to activate the first word line WLa, the first transistor 102 turns ON and the potential on the first bit line BLa starts to rise to perform the readout or refresh operation. Thereafter, when the second clock signal BCLK is asserted to the "H" level to activate the second word line WLb, the second transistor 103 turns ON and the operation of writing "L" starts.

At this point in time, the first word line WLa is still at the "H" level, and therefore the first and second transistors 102 and 103 are both ON at the same time. As a result, excessive current flows from the first bit line BLa at the higher potential into the second bit line BLb at the lower potential. Thus, it takes a long time for the potential on the second bit line BLb to fall to the "L" level. This "overlapping access" state lasts for a period of time To until the first word line WLa is deactivated. After the first word line WLa has been deactivated, the potential on the second bit line BLb goes on falling. But the second word line WLb is deactivated before the potential on the second bit line BLb reaches the "L" level. Thus, the potential at the storage node 101 in the memory cell to be written does not reach the "L" level.

In the same way, when information "H" is written by the overlapping access on a memory cell associated with the same row address as another memory cell on which information "L" is stored, the potential at the storage node 101 in the memory cell to be written does not reach "H" level.

Thus, information can be retained in a memory cell for a shorter period of time or stored information might disappear in some cases.

For that reason, the overlapping access should be avoided in accessing memory cells associated with the same row address consecutively. In the following description, a semiconductor memory device that adopts the overlapping access only when memory cells associated with the same row address are not accessed consecutively will be exemplified.

EMBODIMENT 2

Figure 8:
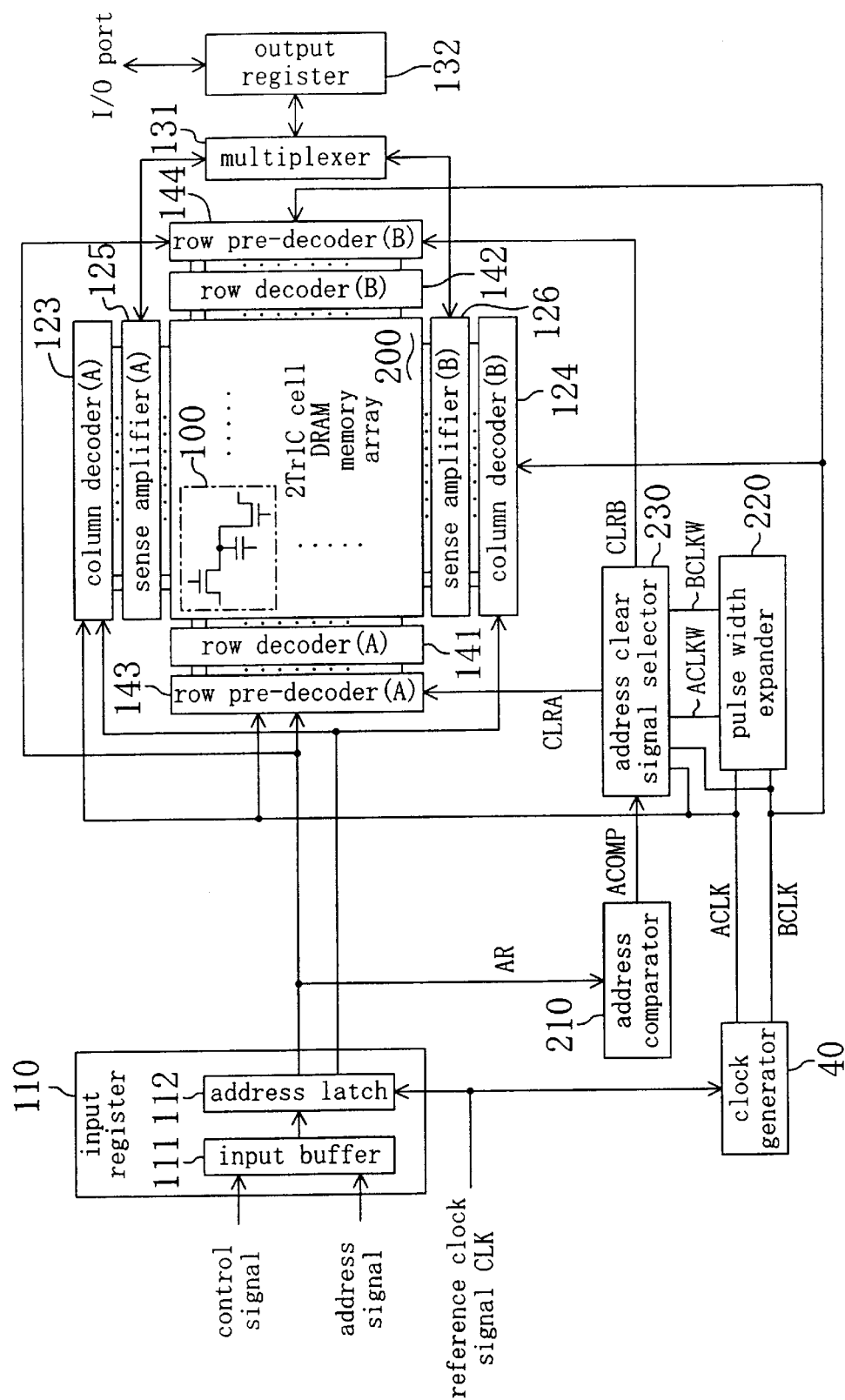
FIG. 8 is a block diagram illustrating an overall configuration for a semiconductor memory device according to a second embodiment of the present invention.

FIG. 8 illustrates an overall configuration for a semiconductor memory device according to a second embodiment of the present invention. As shown in FIG. 8, the semiconductor memory device according to the second embodiment further includes address comparator 210, pulse width expander 220 and address clear signal selector 230 in addition to all the components of the counterpart shown in FIG. 1. In the second embodiment, however, the clock generator 10 shown in FIG. 1 is replaced with the clock generator 40 shown in FIG. 4 according to the modified example of the first embodiment. Also, the input register 110 includes input buffer 111 and address latch 112. In FIG. 8, the row decoders (A) 121 and (B) 122 of the semiconductor memory device shown in FIG. 1 are subdivided into row decoder (A) 141 and pre-decoder (A) 143 and row decoder (B) 142 and pre-decoder (B) 144, respectively. The same components as those included in the semiconductor memory device shown in FIG. 1 are identified by the same reference numerals and the description thereof will be omitted herein.

The input buffer 111 receives a control signal and an address signal and then output the address signal to the address latch 112. Responsive to the reference clock signal CLK, the address latch 112 outputs a row address signal AR as an internal address to the row pre-decoders (A) 143 and (B) 144 and the address comparator 210 and also outputs a column address signal as another internal address to the column decoders (A) 123 and (B) 124.

In response to the reference clock signal CLK externally input, the clock generator 40 generates the first and second clock signals ACLK and BCLK. Then, the clock generator 40 outputs the first clock signal ACLK to the row pre-decoder (A) 143, column decoder (A) 123, pulse width expander 220 and address clear signal selector 230. The clock generator 40 also outputs the second clock signal BCLK to the row pre-decoder (B) 144, column decoder (B) 124, pulse width expander 220 and address clear signal selector 230.

If the address comparator 210 has sensed a change of the row address signal AR, then the address comparator 210 outputs a positive pulse with a predetermined width as an address comparison signal ACOMP to the address clear signal selector 230. The pulse width expander 220 extends the length of the "H" intervals of the first and second clock signals ACLK and BCLK and then outputs these signals as first and second expanded clock signals ACLKW and BCLKW to the address clear signal selector 230.

If the address comparison signal ACOMP is "L", then the address clear signal selector 230 selects the first and second clock signals ACLK and BCLK as first and second address clear signals CLRA and CLRB, respectively. Alternatively, if the address comparison signal ACOMP is "H", then the address clear signal selector 230 selects the first and second expanded clock signals ACLKW and BCLKW as first and second address clear signals CLRA and CLRB, respectively. Then, the address clear signal selector 230 outputs the first and second address clear signals CLRA and CLRB to the row pre-decoders (A) 143 and (B) 144, respectively.

When the first clock signal ACLK rises to the "H" level, the row pre-decoder (A) 143 and decoder (A) 141 activate a first word line WLa specified by the row address signal AR. Similarly, when the second clock signal BCLK rises to the "H" level, the row pre-decoder (B) 144 and decoder (B) 142 activate a second word line WLb specified by the row address signal AR.

The row pre-decoders (A) 143 and (B) 144 are reset when the first and second address clear signals CLRA and CLRB fall from the "H" into "L" level, respectively. Once the row pre-decoder (A) 143 has been reset, the row decoder (A) 141 deactivates all the first word lines WLa. In the same way, once the row pre-decoder (B) 144 has been reset, the row decoder (B) 142 deactivates all the second word lines WLb.

Figure 9:
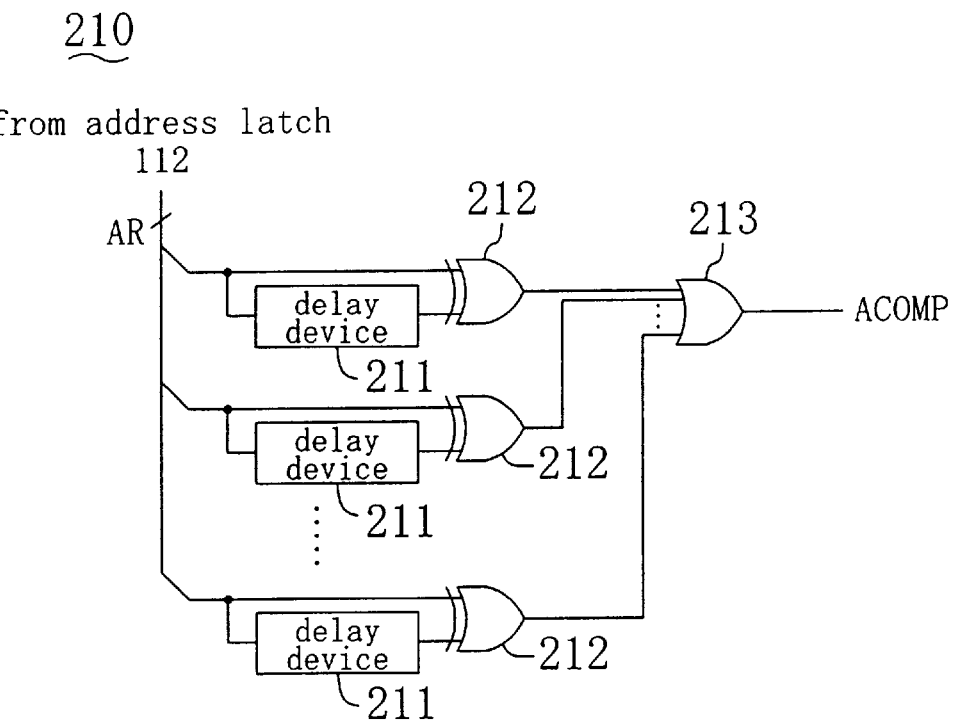
FIG. 9 is a circuit diagram illustrating an address comparator.

FIG. 9 illustrates a circuit configuration for the address comparator 210. As shown in FIG. 9, the address comparator 210 includes: an OR gate 213; and multiple pairs of delay devices 211 and two-input exclusive OR gates 212 corresponding to the respective bits of the row address signal AR.

In FIG. 9, each bit of the row address signal AR is input to the delay device 211 and one of the input terminals of the exclusive OR gate 212 that are associated with the bit. The delay device 211 delays the input signal for a predetermined time $\pi 1$ and then outputs the delayed signal to the other input terminal of the exclusive OR gate 212. The exclusive OR gate 212 provides its output signal to the OR gate 213. In response, the OR gate 213 outputs the OR of the received signals as the address comparison signal ACOMP.

Only when the levels of the two signals received are not equal to each other, the exclusive OR gate 212 outputs an "H" level signal. If one of the bits of the row address signal AR has changed its level, then the exclusive OR gate 212 associated with the bit changed outputs a positive pulse with the predetermined width $\pi 1$. Accordingly, no matter which bit has changed, the address comparator 210 outputs, as the address comparison signal ACOMP, the same pulse.

Figure 10:
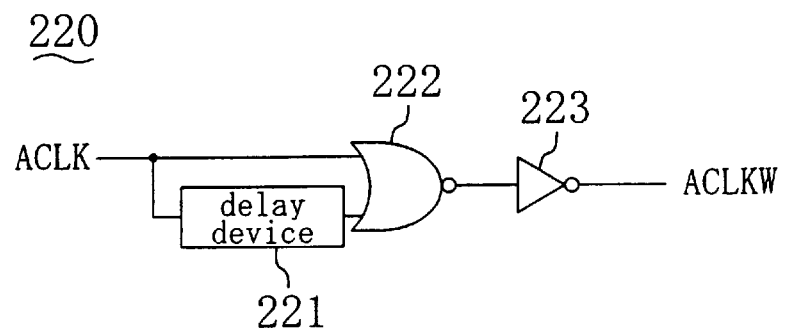
FIG. 10 is a circuit diagram illustrating a pulse width expander.

FIG. 10 illustrates a circuit configuration for the pulse width expander 220. As shown in FIG. 10, the pulse width expander 220 includes delay device 221, NOR gate 222 and inverter 223.

In the example illustrated in FIG. 10, the first clock signal ACLK is input to the delay device 221 and one of the input terminals of the NOR gate 222. The delay device 221 delays the first clock signal ACLK for a predetermined time $\pi 2$ and then outputs the delayed signal to the other input terminal of the NOR gate 222. The NOR gate 222 provides its output signal as the first expanded clock signal ACLKW via the inverter 223.

If at least one of the two inputs to the NOR gate 222 is "H", then the output of the NOR gate 222 is "L" and the first expanded clock signal ACLKW output from the inverter 223 is "H". The output of the delay device 221 rises to the "H" level the predetermined time $\pi 2$ after the first clock signal ACLK rose to the "H" level or falls to the "L" level the predetermined time $\pi 2$ after the first clock signal ACLK fell to the "L" level. In this case, the predetermined time $\pi 2$ is supposed to be shorter than the interval during which the first clock signal ACLK is "H". Accordingly, the first expanded clock signal ACLKW remains "H" after the first clock signal ACLK has risen to the "H" level and until the output of the delay device 221 falls to the "L" level. That is to say, the "H" interval of the first expanded clock signal ACLKW is longer than that of the first clock signal ACLK by the predetermined time $\pi 2$.

The pulse width expander 220 also includes the same circuit section as that illustrated in FIG. 10 for the second clock signal BCLK. That is to say, the pulse width expander 220 outputs a signal, which remains "H" for an interval longer than the "H" interval of the second clock signal BCLK by the predetermined time $\pi 2$, as the second expanded clock signal BCLKW.

Figure 11:
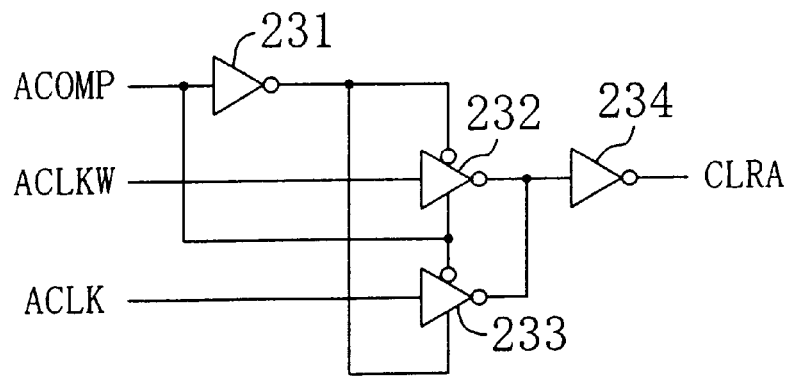
FIG. 11 is a circuit diagram illustrating an address clear signal selector.

FIG. 11 illustrates a circuit configuration for the address clear signal selector 230. As shown in FIG. 11, the address clear signal selector 230 includes inverters 231 and 234 and tristate inverters 232 and 233.

In the example illustrated in FIG. 11, the first expanded clock signal ACLKW and first clock signal ACLK are input to the tristate inverters 232 and 233, respectively. The address comparison signal ACOMP and the output of the inverter 231, which is the inverted version of the address comparison signal ACOMP, control the tristate inverters 232 and 233. Specifically, when the address comparison signal ACOMP is "H", only the tristate inverter 232 turns ON. Alternatively, when the address comparison signal ACOMP is "L", only the tristate inverter 233 turns ON. Then, the tristate inverter 232 or 233 outputs the inverted version of its input signal. In response, the inverter 234 inverts the output of the tristate inverter 232 or 233 and then outputs the inverted signal as the first address clear signal CLRA.

Figure 12:
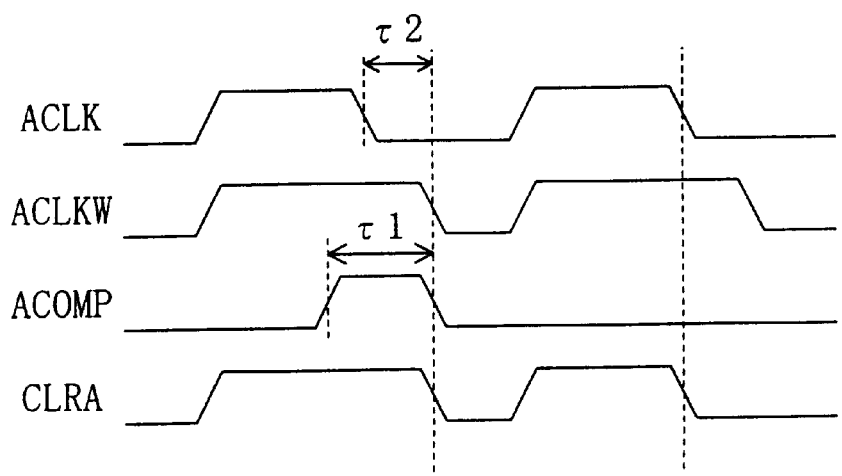
FIG. 12 is a timing diagram illustrating how the address clear signal selector operates.

FIG. 12 illustrates how the address clear signal selector 230 operates. As shown in FIG. 12, the first expanded clock signal ACLKW remains "H" for an interval longer than the "H" interval of the first clock signal ACLK by the predetermined time π2. If the address change of the row address signal AR has been detected, then the address comparison signal ACOMP is "H" for the predetermined time π1.

If the address change of the row address signal AR has been detected, then the address comparison signal ACOMP rises to the "H" level while the first clock signal ACLK is "H". And as soon as the first expanded clock signal ACLKW has fallen to the "L" level, the address comparison signal ACOMP falls to the "L" level. Thus, the first address clear signal CLRA is the same as the first expanded clock signal ACLKW in such a situation.

On the other hand, if no address change of the row address signal AR is detected, the address comparison signal ACOMP remains "L". Thus, the first address clear signal CLRA is the same as the first clock signal ACLK in such a situation.

That is to say, if the address change of the row address signal AR has been detected, then the address clear signal selector 230 selectively outputs the first expanded clock signal ACLKW as the first address clear signal CLRA to the row pre-decoder (A) 143. On the other hand, if no address change of the row address signal AR has been detected, then the address clear signal selector 230 selectively outputs the first clock signal ACLK as the first address clear signal CLRA to the row pre-decoder (A) 143.

The address clear signal selector 230 further includes another circuit section with the same configuration as that illustrated in FIG. 11. Using that circuit section, the address clear signal selector 230 selectively outputs the second expanded clock signal BCLKW as the second address clear signal CLRB to the row pre-decoder (B) 144 if the address change of the row address signal AR has been detected. On the other hand, if no address change of the row address signal AR has been detected, then the address clear signal selector 230 selectively outputs the second clock signal BCLK as the second address clear signal CLRB to the row pre-decoder (B) 144.

Figure 13:
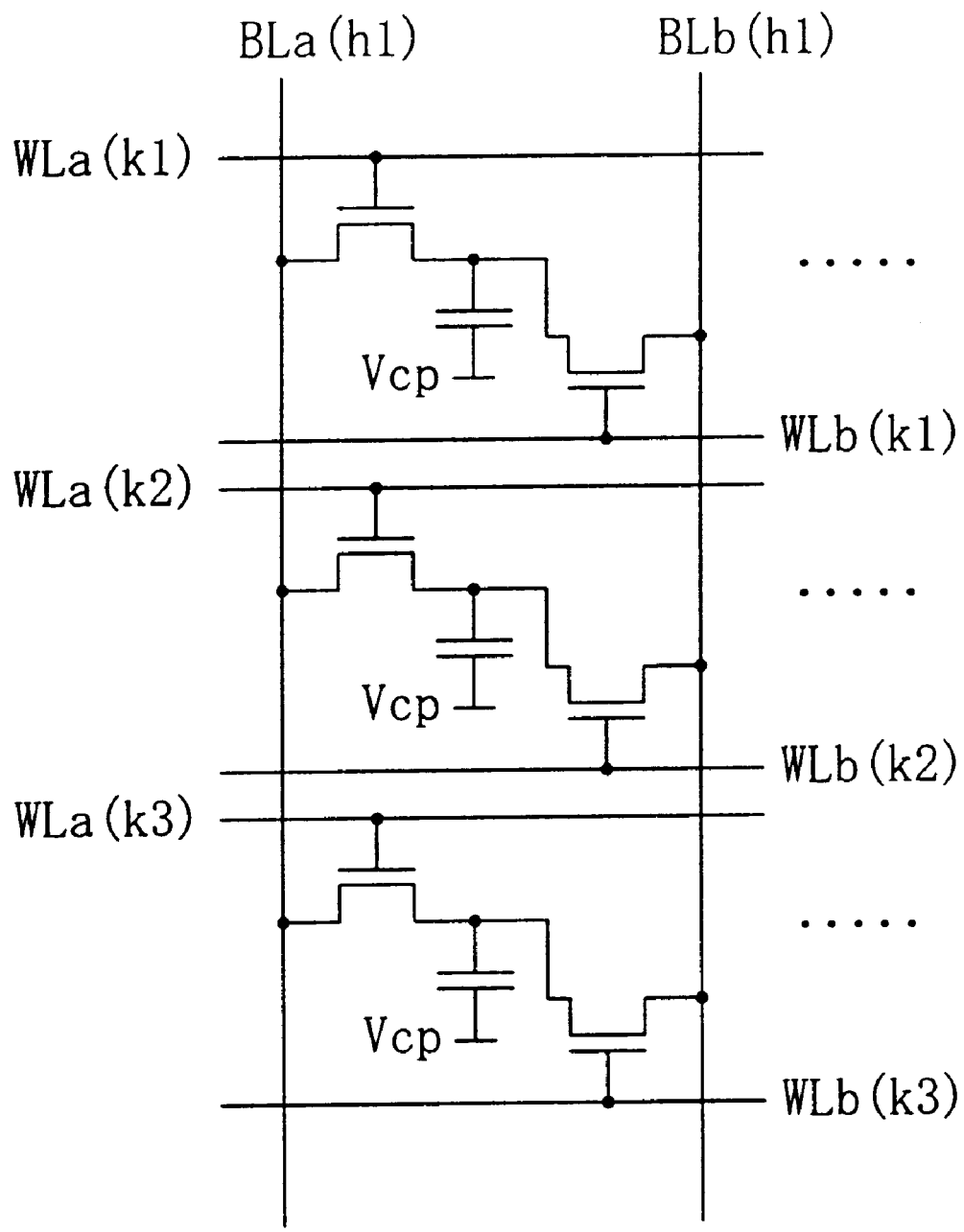
FIG. 13 is a circuit diagram illustrating part of the DRAM memory array shown in FIG. 8.

FIG. 13 illustrates a circuit configuration for a part of the DRAM memory array 200 shown in FIG. 8. In FIG. 13, illustrated are: memory cells associated with row addresses k1, k2 and k3 and with a column address h1; first word lines WLa(k1), WLa(k2) and WLa(k3) for driving the first transistors of the memory cells associated with these row addresses; second word lines WLb(k1), WLb(k2) and WLb(k3) for driving the second transistors of the memory cells associated with these row addresses; and first and second bit lines BLa(h1) and BLb(h1) associated with the column address h1.

Figure 14:
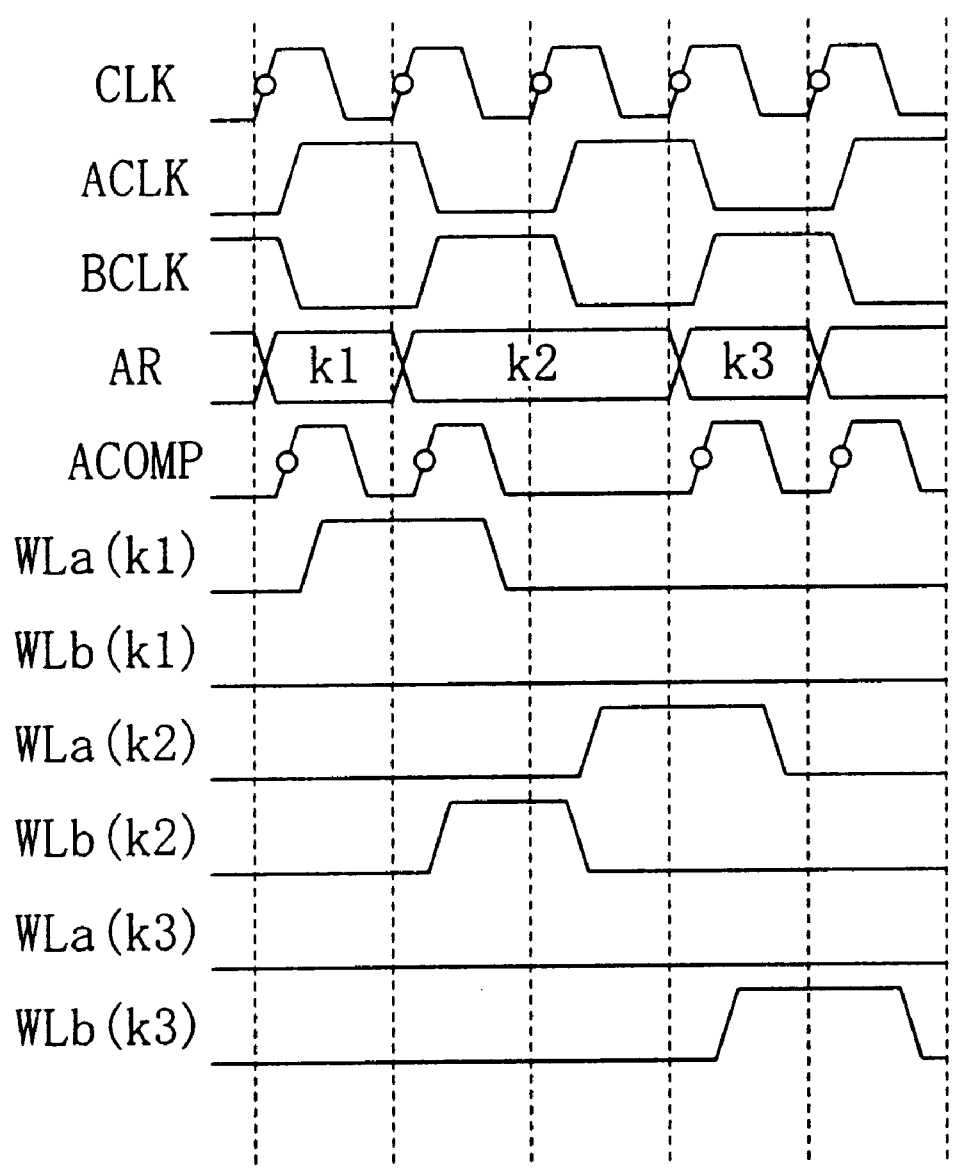
FIG. 14 is a timing diagram illustrating how the semiconductor memory device shown in FIG. 8 operates.

FIG. 14 illustrates how the semiconductor memory device shown in FIG. 8 operates. In the following example, it will be described how to access the memory cells associated with the row addresses k1, k2 and k3 shown in FIG. 13. In the example illustrated in FIG. 13, these row addresses k1, k2 and k3 are consecutive. However, a similar statement is applicable even to a situation where these addresses k1, k2 and k3 are not consecutive.

In response to the reference clock signal CLK, the clock generator 40 outputs the first and second clock signals ACLK and BCLK, which have a complementary level relationship. That is to say, while one of the first and second clock signals ACLK and BCLK is at the "H" level, the other is at the "L" level.

Suppose k1 is output as the row address signal AR from the address latch 112. In such a case, when the first clock signal ACLK rises to the "H" level, the row pre-decoder (A) 143 and decoder (A) 141 activate the first word line WLa(k1) associated with the row address k1. Then, the memory cells associated with the row address k1 are now accessible.

Next, suppose the row address signal AR changes into k2 when the next pulse of the reference clock signal CLK is input. In such a case, when the second clock signal BCLK rises to the "H" level, the row pre-decoder (B) 144 and decoder (B) 142 activate the second word line WLb(k2) associated with the row address k2. Then, the memory cells associated with the row address k2 are now accessible.

On the other hand, the address comparator 210 detects the address change of the row address signal AR and outputs the address comparison signal ACOMP, which remains "H" for the predetermined time π1, to the address clear signal selector 230. In response, the address clear signal selector 230 outputs the first expanded clock signal ACLKW, which has been output from the pulse width expander 220, as the first address clear signal CLRA.

Since the first address clear signal CLRA falls to the "L" level after the second word line WLb(k2) has been activated, the second word line WLb(k2) associated with the row address k2 and the first word line WLa(k1) associated with the row address k1 are both activated for a while at the same time. Thus, there is an interval during which two memory cells, i.e., one of the memory cells associated with the row address k1 and one of the memory cells associated with the row address k2, are accessible simultaneously. However, no problem happens in this case, because these word lines WLa(k1) and WLb(k2) are supposed to drive different memory cells. By the time the address comparison signal ACOMP falls to the "L" level, the first address clear signal CLRA falls to the "L" level to reset the row pre-decoder (A) 143. Accordingly, the first word line WLa(k1) associated with the row address k1 is deactivated.

Subsequently, suppose the row address signal AR does change but the first clock signal ACLK changes its level when the next pulse of the reference clock signal CLK is input. In such a case, when the first clock signal ACLK rises to the "H" level, the row pre-decoder (A) 143 and decoder (A) 141 activate the first word line WLa(k2) associated with the row address k2.

On the other hand, since the address comparator 210 detects no address change of the row address signal AR, the comparator 210 keeps the address comparison signal ACOMP "L". Thus, the address clear signal selector 230 outputs the second clock signal BCLK as the second address clear signal CLRB.

When the second address clear signal CLRB falls to the "L" level, the first clock signal ACLK rises to the "H" level. Accordingly, the first and second word lines WLa(k2) and WLb(k2) associated with the same row address k2 are not both activated at the same time. That is to say, the two transistors in each of the memory cells associated with the row address k2 do not turn ON simultaneously.

Next, suppose the row address signal AR changes into k3 when the next pulse of the reference clock signal CLK is input. In such a case, when the second clock signal BCLK rises to the "H" level, the row pre-decoder (B) 144 and decoder (B) 142 activate the second word line WLb(k3) associated with the row address k3. Since the first address clear signal CLRA falls to the "L" level after the second word line WLb(k3) has been activated, the second word line WLb(k3) associated with the row address k3 and the first word line WLa(k2) associated with the row address k2 are both activated for a while at the same time. Thus, there is an interval during which two memory cells are accessible simultaneously.

In the example illustrated in FIG. 14, the second word line WLb(k2) associated with the row address k2 is activated for a relatively short time, but there is no problem. This is because the first word line WLa(k2) associated with the same row address is activated just after that and the memory cells associated with the same row address k2 are accessed. This operation will be detailed below. In the following description, the access through the second word line WLb (k2) shown in FIG. 14 will be called "preceding access" and the access through the first word line WLa(k2) will be called "succeeding access".

The succeeding access is performed just after the preceding access is finished. Thus, if the succeeding access is readout or refresh operation, then even data that has been restored or written incompletely during the preceding access can be restored correctly. Also, if the succeeding access is write operation, then the data has only to be written correctly during the succeeding access, no matter how the preceding access is finished.

In this manner, a semiconductor memory device according to this embodiment adopts the overlapping access by activating one of the first word lines WLa and one of the second word lines WLb simultaneously if a memory cell associated with the same row address is not accessed consecutively. And only when a memory cell associated with the same row address should be accessed consecutively, the memory device avoids the overlapping access.

EMBODIMENT 3

Figure 15:
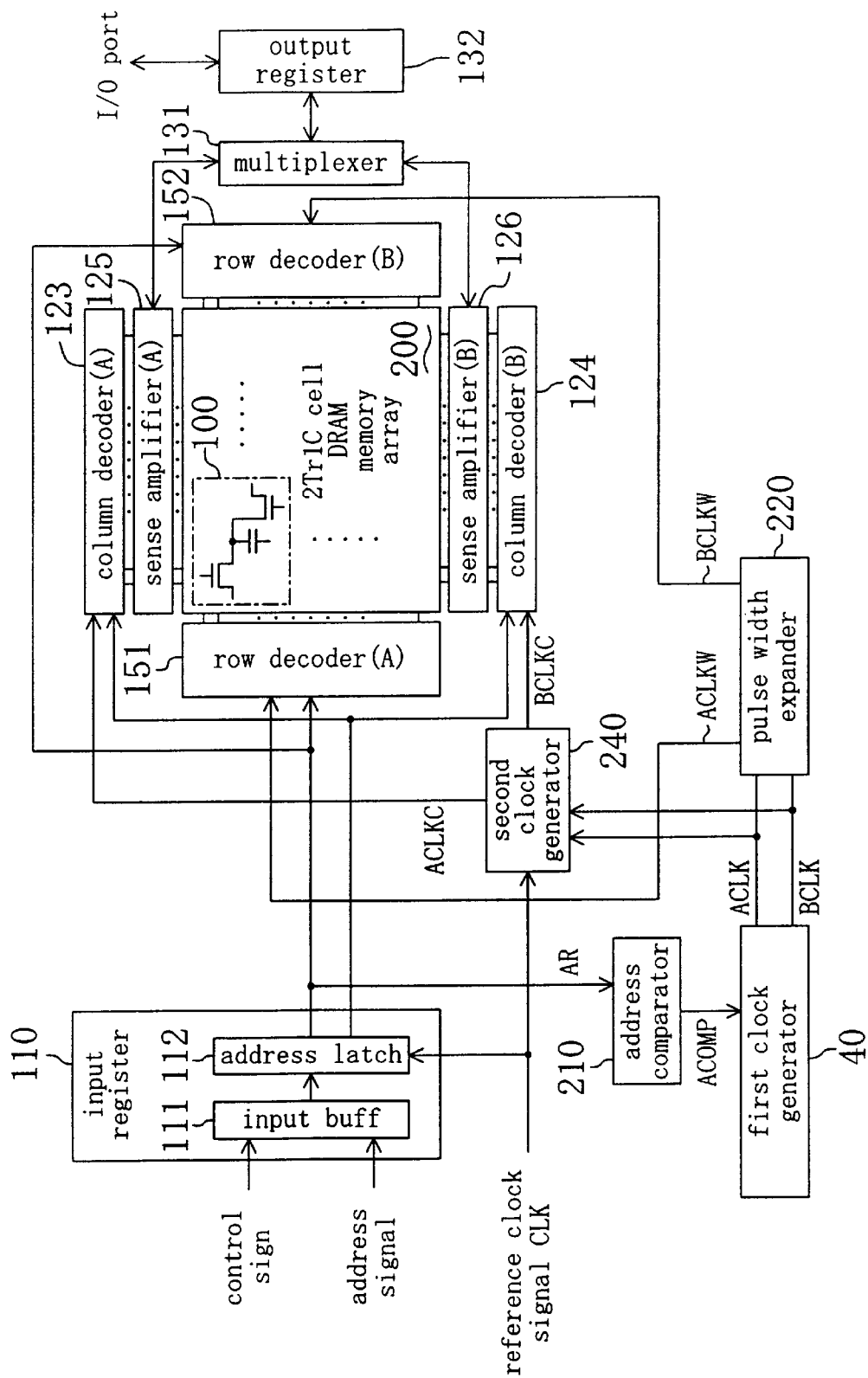
FIG. 15 is a block diagram illustrating an overall configuration for a semiconductor memory device according to a third embodiment of the present invention.

FIG. 15 illustrates an overall configuration for a semiconductor memory device according to a third embodiment of the present invention. As shown in FIG. 15, the semiconductor memory device according to the third embodiment further includes a second clock generator 240 in addition to all the components of the semiconductor memory device of the second embodiment shown in FIG. 8, except for the address clear signal selector 230. In FIG. 15, the row pre-decoder (A) 143 and decoder (A) 141 shown in FIG. 8 are simply illustrated as a row decoder (A) 151, and the row pre-decoder (B) 144 and decoder (B) 142 shown in FIG. 8 are simply illustrated as a row decoder (B) 152. The same components as those included in the semiconductor memory device shown in FIG. 8 are identified by the same reference numerals and the description thereof will be omitted herein.

If the address comparator 210 has sensed the change of the row address signal AR, then the address comparator 210 outputs a positive pulse with the predetermined time width $\pi 1$ as an address comparison signal ACOMP to the first clock generator 40.

The first clock generator 40 has the same configuration as the counterpart illustrated in FIG. 4, and receives the address comparison signal ACOMP from the address comparator 210, not the reference clock signal CLK. In response to the address comparison signal ACOMP, the first clock generator 40 generates the first and second clock signals ACLK and BCLK and outputs these signals to the pulse width expander 220 and the second clock generator 240.

The pulse width expander 220 outputs the first and second expanded clock signals ACLKW and BCLKW to the row decoders (A) 151 and (B) 152, respectively.

When the first clock signal ACLK rises to the "H" level, the row decoder (A) 151 activates a first word line WLa specified by the row address signal AR. In the same way, when the second clock signal BCLK rises to the "H" level, the row decoder (B) 152 activates a second word line WLa specified by the row address signal AR.

The row decoders (A) 151 and (B) 152 are reset when the first and second expanded clock signals ACLKW and BCLKW fall from the "H" into "L" level, respectively. Once reset, the row decoder (A) 151 deactivates all the first word lines WLa and the row decoder (B) 152 deactivates all the second word lines WLb.

The second clock generator 240 receives the reference clock signal CLK and the first and second clock signals ACLK and BCLK. Based on these input signals, the second clock generator 240 generates first and second column clock signals ACLKC and BCLKC and outputs these signals to the column decoders (A) 123 and (B) 124, respectively.

Figure 16:
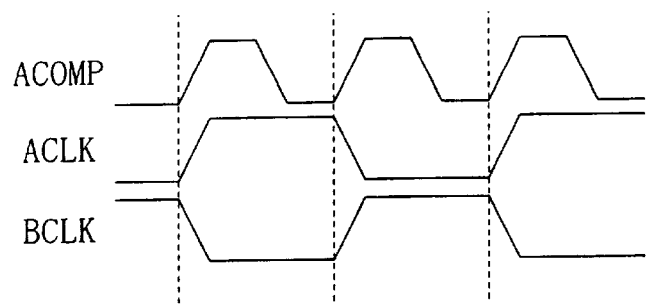
FIG. 16 is a timing diagram illustrating how a first clock generator operates.

FIG. 16 illustrates how the first clock generator 40 operates. As shown in FIG. 16, every time the address comparison signal ACOMP rises from the "L" into "H" level, the levels of the first and second clock signals ACLK and BCLK are both inverted.

Figure 17:
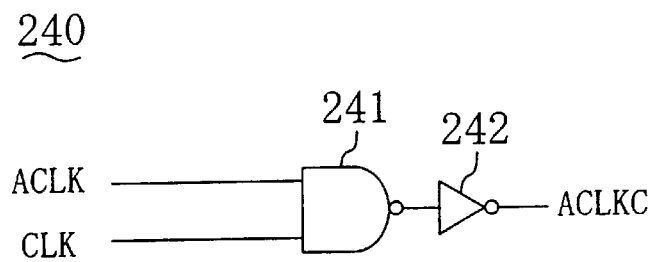
FIG. 17 is a circuit diagram illustrating a second clock generator.

FIG. 17 illustrates a circuit configuration for the second clock generator 240. In the example illustrated in FIG. 17, the second clock generator 240 includes: a NAND gate 241 receiving the first clock signal ACLK and reference clock signal CLK; and an inverter 242, which inverts the output of the NAND gate 241 and then outputs it as the first column clock signal ACLKC. Although not shown in FIG. 17, the second clock generator 240 also includes a circuit section that receives the second clock signal BCLK and reference clock signal CLK and outputs the second column clock signal BCLKC.

Figure 18:
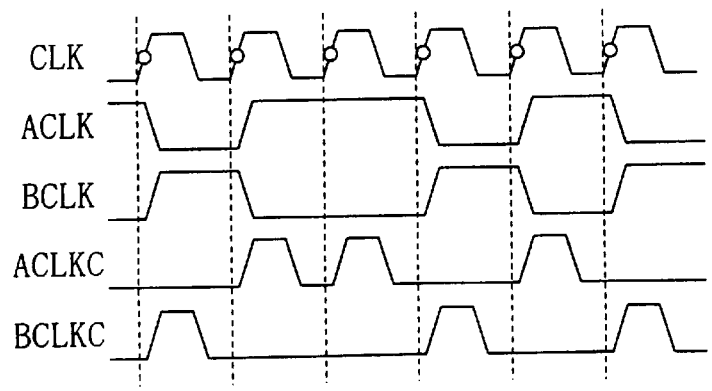
FIG. 18 is a timing diagram illustrating how the second clock generator operates.

FIG. 18 illustrates how the second clock generator 240 operates. As shown in FIG. 18, the second clock generator 240 outputs the reference clock signal CLK as the first column clock signal ACLKC only while the first clock signal ACLK is "H", and outputs the reference clock signal CLK as the second column clock signal BCLKC only while the second clock signal BCLK is "H".

Figure 19:
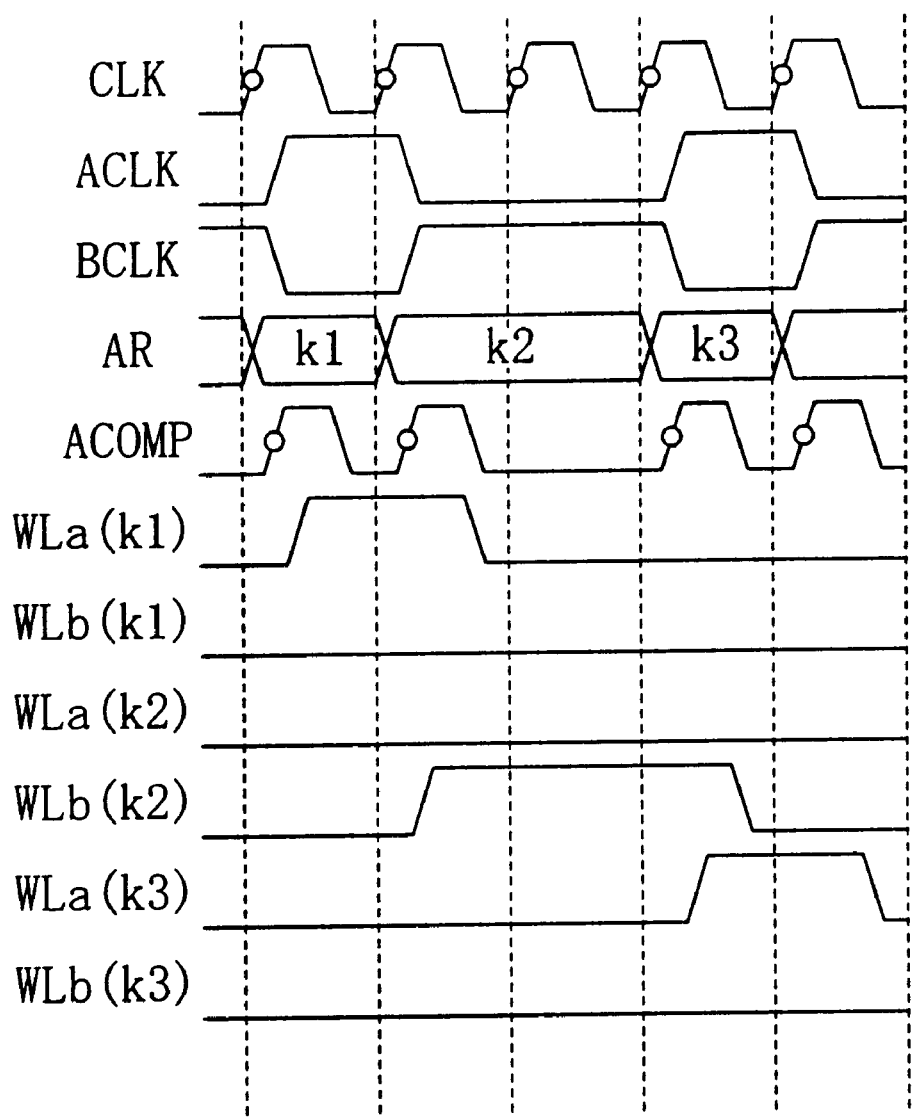
FIG. 19 is a timing diagram illustrating how the semiconductor memory device shown in FIG. 15 operates.

FIG. 19 illustrates how the semiconductor memory device shown in FIG. 15 operates. In the following example, it will be described how to access the memory cells associated with the row addresses k1, k2 and k3 shown in FIG. 13.

Suppose the row address signal AR output from the address latch 112 has changed from a certain address into k1. In such a case, the address comparator 210 senses the change of the row address signal AR and outputs the address comparison signal ACOMP as a pulse. When the address comparison signal ACOMP rises to the "H" level, the first clock generator 40 changes the levels of the first and second clock signals ACLK and BCLK into "H" and "L" levels, respectively. And when the first clock signal ACLK rises to the "H" level, the row decoder (A) 151 activates the first word line WLa(k1) associated with the row address k1. As a result, the memory cells associated with the row address k1 are now accessible.

Next, suppose the row address signal AR changes into k2 when the next pulse of the reference clock signal CLK is input. In such a case, the address comparator 210 outputs the address comparison signal ACOMP as a pulse. When the address comparison signal ACOMP rises to the "H" level, the first clock generator 40 changes the levels of the first and second clock signals ACLK and BCLK into "L" and "H" levels, respectively. And when the second clock signal BCLK rises to the "H" level, the row decoder (B) 152 activates the second word line WLb(k2) associated with the row address k2. As a result, the memory cells associated with the row address k2 are now accessible.

Since the first expanded clock signal ACLKW falls to the "L" level after the second word line WLb(k2) has been activated, the second word line WLb(k2) associated with the row address k2 and the first word line WLa(k1) associated with the row address k1 are both activated for a while at the same time. Thus, there is an interval during which two memory cells are accessible simultaneously. However, no problem happens in this case, because these word lines WLa(k1) and WLb(k2) are supposed to drive different memory cells. When the first expanded clock signal ACLKW falls to the "L" level, the row decoder (A) 151 is reset. Accordingly, the first word line WLa(k1) associated with the row address k1 is deactivated.

Subsequently, suppose the row address signal AR does change when the next pulse of the reference clock signal CLK is input. In such a case, the address comparator 210 detects no address change of the row address signal AR, and the comparator 210 keeps the address comparison signal ACOMP "L". Since the address comparison signal ACOMP does not change, the first clock generator 40 retains the levels of the first and second clock signals ACLK and BCLK as they are. The row decoder (B) 152 continues to activate the second word line WLb(k2) associated with the row address k2.

In this case, the second clock generator 240 provides the second column clock signal BCLKC shown in FIG. 18 to the column decoder (B) 124. Accordingly, the column decoder (B) 124 continuously operates and therefore another memory cell associated with the same row address is also accessible.

Next, suppose the row address signal AR changes into k3 when the next pulse of the reference clock signal CLK is input. In such a case, when the first clock signal ACLK rises to the "H" level, the row decoder (A) 151 activates the first word line WLa(k3) associated with the row address k3. Since the second expanded clock signal BCLKW falls to the "L" level after the first word line WLa(k3) has been activated, the first word line WLa(k3) associated with the row address k3 and the second word line WLb(k2) associated with the row address k2 are both activated for a while at the same time. Thus, there is an interval during which two memory cells are accessible simultaneously.

According to the third embodiment, when a memory cell associated with the same row address is accessed consecutively, the level changes of the first and second clock signals ACLK and BCLK are suspended, thus providing a semiconductor memory device that can avoid the overlapping access.

The clock generator 40 adopted in the second and third embodiments of the present invention may be replaced with the clock generator 10 or 50 shown in FIG. 2 or 5, for example.

As is apparent from the foregoing description, a 2Tr1C memory cell including two transfer devices can operate efficiently in the inventive semiconductor memory device without providing any special select signal or two clock signals externally. Thus, the present invention provides a conveniently usable semiconductor memory device operable at high speeds.

What is claimed is:

1. A semiconductor memory device comprising a plurality of memory cells, each said memory cell including a charge storage device and first and second transfer devices, the first transfer device being driven by a first word line and connected between the charge storage device and a first data input/output line for transferring charge, the second transfer device being driven by a second word line and connected between the charge storage device and a second data input/output line for transferring charge, wherein the memory device further includes a clock generator for generating first and second mutually complementary clock signals, wherein the clock generator includes control means for suspending the level changes of the first and second clock signals, and for making the first and second signals change into respectively predetermined levels when these signals start changing their levels, and wherein in response to the first and second clock signals, one of the first word lines and one of the second word lines are activated alternately, and wherein the clock generator adaptively changes levels of the first and second clock signals based on a level change of an external reference clock signal.

2. The memory device of claim 1, wherein the control means suspends the level changes of the first and second clock signals in response to a clock enable signal.

3. A semiconductor memory device comprising a plurality of memory cells, each said memory cell including a charge storage device and first and second transfer devices, the first transfer device being driven by a first word line and connected between the charge storage device and a first data input/output line for transferring charge, the second transfer device being driven by a second word line and connected between the charge storage device and a second data input/output line for transferring charge, wherein the memory device further includes:
a clock generator for generating first and second mutually complementary clock signals; and
an address comparator for detecting a change of row addresses, wherein in response to the first and second clock signals, one of the first word lines and one of the second word lines are activated alternately, wherein if the address comparator has sensed that a previous row address has been replaced with a new row address, then there is an interval during which one of the word lines that is associated with the previous row address and another one of the word lines that is associated with the new row address are both activated, and wherein if the address comparator has sensed no row address change, then there is no interval during which the first and second word lines that are associated with a current row address are both activated.

4. The memory device of claim 3, wherein if the address comparator has sensed no row address change, then an activated one of the first and second word lines that are associated with a current row address is deactivated at a first time, and wherein if the address comparator has sensed that a previous row address has been replaced with a new row address, then an activated one of the word lines that is associated with the previous row address is deactivated at a second time, and wherein an interval between a reference point in time the address comparator made a comparison and the first time is shorter than an interval between the reference point and the second time.

5. The memory device of claim 3, wherein if the address comparator has sensed no row address change, then the changes in signal levels on the first and second word lines are suspended.

* * * * *